(12) United States Patent
Chatterjee et al.

(10) Patent No.: US 8,456,195 B2
(45) Date of Patent: *Jun. 4, 2013

(54) SYSTEM AND METHOD FOR ON-CHIP JITTER AND DUTY CYCLE MEASUREMENT

(75) Inventors: Kallol Chatterjee, Noida (IN); Anurag Tiwari, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/446,946

(22) Filed: Apr. 13, 2012

(65) Prior Publication Data

US 2012/0218002 A1     Aug. 30, 2012

Related U.S. Application Data

(63) Continuation of application No. 12/498,164, filed on Jul. 6, 2009, now Pat. No. 8,159,272.

(30) Foreign Application Priority Data

Jul. 4, 2008 (IN) .......................... 1614/DEL/2008

(51) Int. Cl.
H03K 9/08      (2006.01)
(52) U.S. Cl.
USPC ............. 327/31; 327/172; 341/155; 341/118; 341/166

(58) Field of Classification Search
USPC ................... 327/31, 170–172; 341/155, 166, 341/167, 118, 157; 702/78, 79
See application file for complete search history.

(56) References Cited

U.S. PATENT DOCUMENTS 7,205,924 B2 * 4/2007 Vemulapalli et al. ......... 341/166

OTHER PUBLICATIONS

Ogawa, T., et al., "A 50% Duty-Cycle Correction Circuit for PLL Output", IEEE ISCAS, May 26-29, 2002, vol. IV., pp. 21-24.

* cited by examiner

*Primary Examiner* — Tuan T Lam
(74) *Attorney, Agent, or Firm* — Hogan Lovells US LLP

(57) ABSTRACT

An apparatus for measuring time interval between two edges of a clock signal and includes an edge generator, a first multi-tap delay module, a second multi-tap delay module, and a multi-element phase detector. The edge generator produces a first edge at a first output node and a second selected edge at a second output node. First multi-tap delay module provides a first incremental delay at each tap to the first edge. Second multi-tap delay module provides a second incremental delay at each tap to the second selected edge. Each element of the multi-element phase detector has first and second input terminals. The first input terminal is coupled to a selected tap of the first multi-tap delay module and the second input terminal is coupled to a corresponding tap of the second multi-tap delay module. The output terminals of the multi-element phase detector provide the value of the time interval.

12 Claims, 5 Drawing Sheets

SYSTEM AND METHOD FOR ON-CHIP JITTER AND DUTY CYCLE MEASUREMENT

RELATED APPLICATION

The present invention is a continuation of U.S. patent application Ser. No. 12/498,164 filed Jul. 6, 2009, now U.S. Pat. No. 8,159,272 which claims the benefit of Indian Patent Application No. 1614/Del/2008 filed Jul. 4, 2008, both of which are incorporated herein by reference in their entireties.

FIELD OF THE INVENTION

The present invention relates to the field of integrated circuits, and more specifically to a system and method for on-chip jitter and duty cycle measurement.

BACKGROUND OF THE INVENTION

Continuous developments in the fields of analog and digital circuits (such as microprocessors and high speed communications) need efficient electronic components. Compatibility and the integrity of clock signals within the circuits is one of the important requirements. System clock performance that was previously acceptable is now insufficient to support the high clock speeds of today's circuits.

During the engineering phase of validation, jitter characterization of phase-locked loop (PLL) clock is a very important check. A typical set-up consists of Wavecrest or some high-end oscilloscope fed-by the clock under measurement through a probe needle from unpackaged die. The IOs not only add extra jitter to the clock under test (CUT) but also in conjunction with the probe needle capacitance limit the maximum clock frequency that can be brought out for measurement. A divided clock can be used, but division removes high-frequency jitter components. In addition, the cost of jitter measurement equipment limit the ability to replicate results simultaneous by a number of testers, thereby severely reducing test throughput for a given budget. Hence, an on-chip jitter measurement solution can help achieve a high test throughput without the need of special high-speed IO's and expensive test-equipment.

The duty cycle of high speed clocks is very important in certain applications like DDR2 (Double Data Rate 2), where read/write operation is performed on both rising and falling edges of the clock. Measuring duty cycle of high speed clocks is thus very important in these applications. Off chip duty cycle measurement of high speed clocks is not feasible due to speed limitations of IO's and additional distortion caused by intermediate buffers. Hence an on-chip measurement scheme is required to accurately measure duty cycle of high-speed clock signals.

In last few years a number of on-chip jitter measurement techniques have been proposed. The jitter measurement techniques can be widely classified into two categories, analog and digital. Analog technique requires an elaborate calibration step and uses charge pumps, analog to digital convertors, etc.

The commonly proposed digital techniques can be classified into three categories:

1) Programmable delay based techniques: In this approach, the CUT is sampled by its delayed version. This delay is programmable. By controlling this delay to be within a certain fraction smaller and larger than the mean time period, a cumulative distribution function (CDF) curve is obtained and from here RMS jitter is calculated. The resolution of this approach is limited to one buffer delay thereby making it unsuitable for high frequency (>200 MHz) clocks. The meta-stability of flip-flop outputs is another implementation issue.

2) Coherent frequency approach: In this approach a crystal or on-board frequency multiplier is used to generate a clock at a slightly different frequency and the CUT is sampled by this clock. If the two clocks are initially aligned in phase and then allowed to drift then after some time the two clocks will re-align. During each time-period, the CUT will be swept across by the reference clock, the sampling resolution being decided by the differential in the two frequencies. By this technique, sampling resolutions much smaller than a gate delay can be obtained. However, the approach suffers from two drawbacks. First of all, special board or testers are needed to generate the other clock. Secondly, the highest frequency clock on which jitter measurement can be done is limited by the IO's speed limitations since the reference clock has to be nearly as fast as the CUT. Although, this limitation can be overcome by sub-sampling at the cost of removal of high-frequency jitter components, the first drawback limits the generality of the approach.

3) Vernier delay line based (VDL) techniques: In this approach, it's possible to obtain sampling resolutions finer than a buffer delay by using two buffer chains which have slightly different propagation delays. This technique has been used for measuring jitter on data w.r.t to clock. If the data is replaced by CUT and another clean clock is used as reference, then jitter on CUT can be estimated. However, this approach can only work for low-frequency clocks because it is not possible to have another clock which is of as high a frequency as the PLL output clock. Usually this technique is used on divided clocks and hence high-frequency jitter components are eliminated. In addition to this it is argued that a very long VDL (for finer sampling resolution) will suffer from buffer mismatch.

FIG. 1 illustrates a conventional time interval measuring device 100 using a component-invariant VDL. A single-stage VDL structure 100 includes a data-triggered oscillator circuit 101, a clock-triggered oscillator circuit 102, and a D-latch 103. Data-triggered oscillator circuit 101 feeds a first signal into the data line input of D-latch 103. Clock-triggered oscillator circuit 102 feeds a second signal into the clock input of the same respective D-latch 103. The output of the D-latch 103 is passed to a counter. Data-triggered oscillator 101 is triggered by a data signal while the clock-triggered oscillator 102 is triggered by a clock signal. In this technique, two oscillators with slightly different oscillation frequencies (much smaller than the frequency of CUT) are designed. The slower oscillator starts oscillating at the first rising edge of the clock and the fast oscillator starts oscillating after a fixed delay provided after the first rising edge. In each oscillation cycle, time difference between the two clocks decreases by $$T_D = T_S - T_F,$$

where
$T_S$=Time period of slow oscillator
$T_F$=Time period of fast Oscillator
$T_D$=sampling resolution.

If the number of cycles required by the fast oscillator to overtake the slow oscillator is N, then the measured time period=$N*T_D$. In this way many measurements are made and again a CDF is plotted and from there the RMS jitter is estimated. The problems with this approach are:

A well-defined delay is required. An elaborate calibration step is also required for estimating $T_D$.

For a small sampling resolution and a large Time-Period, the N above will be large. The jitter in the vernier oscillators will accumulate for N-periods and cause a very large measurement inaccuracy as this inaccuracy will directly add to the jitter estimate in the CUT.

For high-frequency clocks, the accumulated jitter in the oscillators can become larger or comparable to the jitter under measurement. Hence this approach cannot be used reliably for high-frequency clocks.

The test-time can become extremely large, because one sample is acquired per oscillation cycle and the oscillation frequency is typically much smaller than the frequency of CUT.

The measurement of duty-cycle of a clock signal is an important part of most on-chip phase-locked loop (PLL) built-in-self-test (BIST) solutions. Duty cycle is an important PLL clock specification for DDR2 kind of applications and its measurement is a vital part of any PLL BIST solution. The conventional approaches for measuring and correcting duty cycle can be categorized broadly into analog, digital and mixed-signal. Purely analog duty cycle corrector (DCC) circuits like the one proposed by Toru Ogawa, Kenji Taniguchi in ISCAS-2002, Vol. 4, entitled A 50% *Duty-Cycle Correction Circuit for PLL Output*, consist of a voltage controlled oscillator (VCO), operational amplifiers (OPAMP), phase detectors and frequency filters that makes the design extremely resource-hungry. These circuits are obviously not a good choice when die area is the most important constraint. Moreover, in a typical digital BIST environment, purely analog approaches can not be used. Further all the conventional techniques for jitter and duty-cycle measurement require another clock for calibration and special circuit components.

Therefore, there is a need of a system and method for on-chip jitter and duty cycle measurement using a single clock signal.

SUMMARY OF THE INVENTION

To achieve the desired objectives, one embodiment of the present disclosure is a system which includes an apparatus for measuring time interval between two selected edges of a clock signal. The apparatus includes an edge generator having a first output node producing a first edge derived from a first edge of the input clock signal, and a second output node producing a second edge derived from the second selected edge of the input clock signal, a first multi-tap delay module having its input operatively coupled to the first output node of the edge generator for providing a first constant incremental delay at each tap, a second multi-tap delay module having its input operatively coupled to the second output node of the edge generator for providing a second constant incremental delay at each tap where the second constant incremental delay is less than the first constant incremental delay and a multi-element phase detector in which each element has a first input operatively coupled to a selected tap of the first multi-tap delay module, and a second input operatively coupled to a corresponding tap of the second multi-tap delay module. The outputs of the multi-element phase detector provide the value of the desired time interval.

An apparatus for measuring time interval between two selected edges of a clock signal includes an edge generator having a first output node producing a first edge derived from a first edge of the input clock signal, and a second output node producing a second edge derived from the second selected edge of said input clock signal, a first multi-tap delay module having its input operatively coupled to the first output node of the edge generator for providing a first constant incremental delay at each tap, a second multi-tap delay module having its input operatively coupled to the second output node of the edge generator for providing a second constant incremental delay at each tap where the second constant incremental delay is less than the first constant incremental delay and a multi-element phase detector in which each element has a first input operatively coupled to a selected tap of the first multi-tap delay module, and a second input operatively coupled to a corresponding tap of the second multi-tap delay module, the outputs of the multi-element phase detector providing the value of the desired time interval.

The edge generator preferably includes control signals for defining the second selected edge of the input clock signal relative to the first selected edge. The first multi-tap delay module and the second multi-tap delay module preferably includes a plurality of buffers. Each element of the phase detector preferably includes a latch.

A preferred embodiment of a method for measuring the time interval between two selected edges of a clock signal includes generating a first edge derived from a first edge of the input clock signal and a second edge derived from a second selected edge of the input clock signal subsequent to the first edge, providing a first constant incremental stepped delay to the first edge, providing a second constant incremental stepped delay to the second selected edge where the second constant incremental stepped delay is less than said first constant incremental delay, and detecting desired time interval between two selected edges of the clock signal by identifying the step at which the delayed second selected edge overtakes the delayed first edge.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
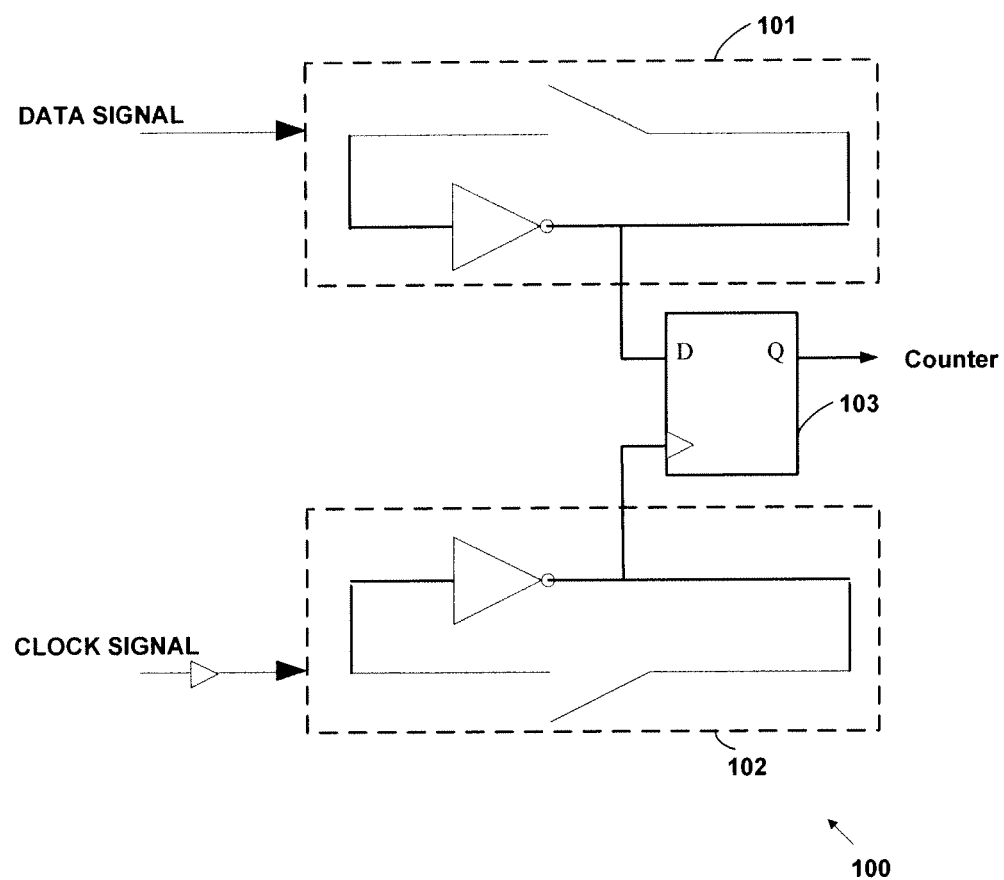
FIG. 1 illustrates a conventional time interval measuring device using a component-invariant vernier delay line.

The embodiments of the present invention will be described in detail with reference to the accompanying drawings. However, the present invention is not limited to these embodiments. The present invention can be modified in various forms. The embodiments of the present invention described herein are only provided to explain more clearly the present invention to the ordinarily skilled in the art of the present invention. In the accompanying drawings, like reference numerals are used to indicate like components.

FIG. 1 illustrates a conventional time interval measuring device 100 using a component-invariant vernier delay line as already explained above in the Background.

Figure 2:
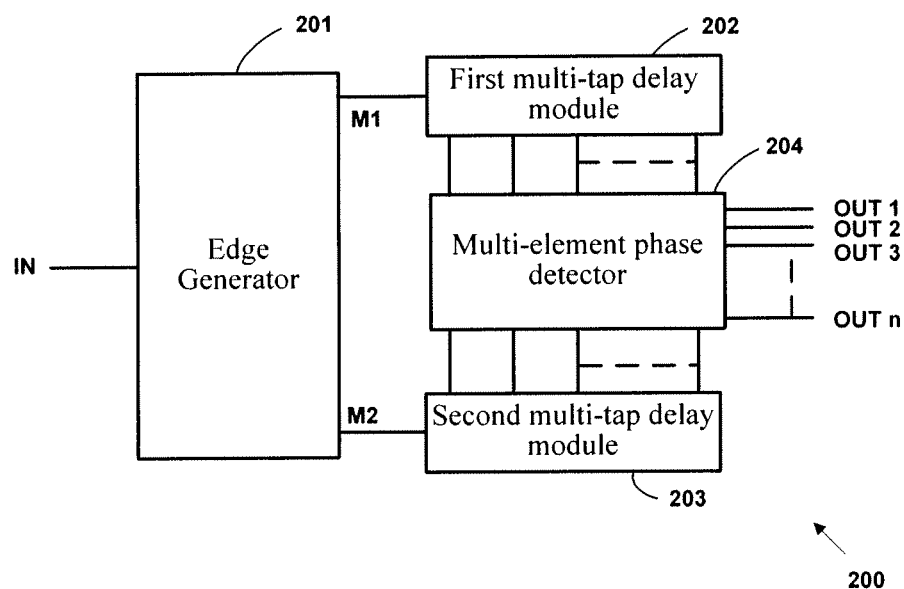
FIG. 2 illustrates the block diagram of an apparatus for measuring time interval between two selected edges of a clock signal according to the present invention.

FIG. 2 illustrates the block diagram of an apparatus 200 for measuring time interval between two selected edges of a clock signal according to the present invention. Apparatus 200 includes an edge generator 201, a first multi-tap delay module 202, a second multi-tap delay module 203, and a multi-element phase detector 204. Edge generator 201 receives an input clock signal IN. Edge generator 201 produces a first edge at a first output node M1 and a second edge at a second output node M2. The first edge is derived from the first edge of the input clock signal IN. The second edge is derived from the second selected edge of the input clock signal IN. The input terminal of the first multi-tap delay module 202 is coupled to the first output node M1 of the edge generator 201. First multi-tap delay module 202 receives the first edge and then provides it a first constant incremental delay at each tap. The input terminal of the second multi-tap delay module 203 is coupled to the second output node M2 of the edge generator 201. Second multi-tap delay module 203 receives the second edge and then provides it a second constant incremental delay at each tap. The second constant incremental delay is less than the first constant incremental delay. Each element of the multi-element phase detector 204 has two input terminals. The first input is coupled to a selected tap of the first multi-tap delay module 202 and the second input is coupled to a corresponding tap of the second multi-tap delay module 203. The output terminals of the multi-element phase detector 204 provide the value of the desired time interval.

Figure 3:
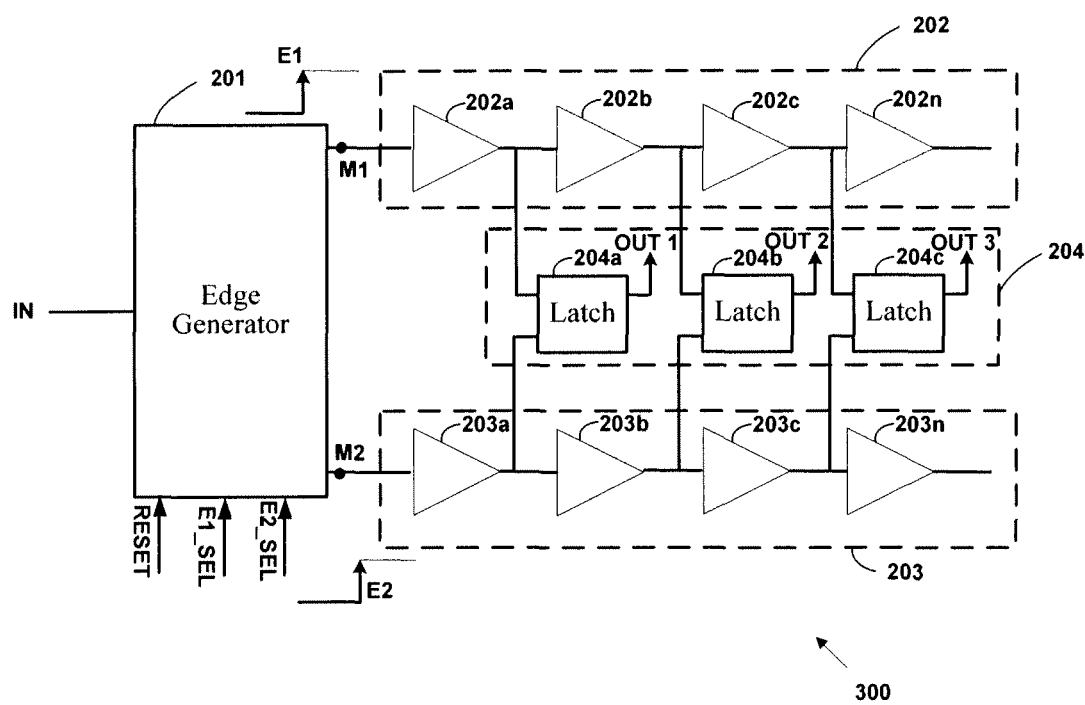
FIG. 3 illustrates the block diagram of an apparatus for measuring time interval between two selected edges of a clock signal according to an embodiment of the present invention.

FIG. 3 illustrates the block diagram of an apparatus 300 for measuring time interval between two selected edges of a clock signal according to an embodiment of the present invention. Edge generator 201 includes an input terminal and three control terminals. The three control terminals provide control signals to the edge generator 201 for defining the second selected edge E2 of the input clock signal relative to the first edge E1. First multi-tap delay module 202 includes a plurality of buffers such as 202a, 202b, 202c, - - - 202n. Second multi-tap delay module 202 also includes a plurality of buffers such as 203a, 203b, 203c, - - - 203n. Multi-element phase detector 204 includes a plurality of latches 204a, 204b, 204c, - - - 204n.

Edge generator 201 receives the input clock signal IN and three other control signals RESET, E1_SEL and E2_SEL and generates two step output edges E1 and E2 at the output nodes M1 and M2 respectively. When RESET is active, output edges E1 and E2 are set to low. When RESET is deactivated, then the first edge E1 and the second edge E2 are generated in response to input clock signal IN. First edge E1 is always generated before the second edge E2. The temporal spacing between the first edge E1 and the second edge E2 can be set equal to one time period or On-Time of CUT or Off-Time of CUT based on the control signals E1_SEL and E2_SEL combination. First edge E1 propagates along the slow buffer chain of first multi-tap delay module 202 and second edge E2 propagates on the fast buffer chain of second multi-tap delay module 203. After each buffer stage, separation between E2 and E1 decreases by $T_D = T_S - T_F$, where $T_D$ = Sampling resolution of the vernier delay line (VDL).
$T_S$ = Propagation delay of slow buffer,
$T_F$ = Propagation delay of faster buffer.

The latches (back to back NAND gates) present at each buffer output act as a phase detector. Initially outputs (OUT1, OUT2, OUT3 etc.) of the multi-element phase detector 204 are all set to high since the edges E1 and E2 are low during reset phase. When the RESET is deactivated, the first edge E1 arrives at the first latch and OUT1 goes low. Similarly, the output OUT2 goes low when the first edge E1 reaches the second buffer 202b before the second edge E2. Since the second edge E2 is generated later but propagates faster, eventually the second edge E2 overtakes the first edge E1 after N delay stages. The output of first N-latches will thus be low while that of the $(N+1)^{th}$ and all subsequent latches will be high. The latch as a phase detector has the advantage of being capable of detecting phase differences as small as 5 ps-10 ps without going into metastability. The phase-detector resolution has to be smaller than $T_D$ (VDL resolution) for this scheme to work with negligible error. If the initial time difference between E1 and E2 is "T", then $T = N*T_D$ In this way the Time interval "T" has been quantized into thermometric code "N" with a resolution of $T_D$. The number of "0"s are then encoded into equivalent binary number. Since T can be chosen to be on-time, off-time or time-period of the clock signal IN, then all these parameters can be extracted by using the same circuit and only changing the select bits E1_SEL and E2_SEL. After each measurement, the RESET signal is activated and then de-activated at a random instant of time to start the next measurement. This randomizes the time-periods which are captured for measurement. Hence, any periodic jitter components do not affect the jitter measurement. This means that if a large enough number of time-periods are averaged, then the mean will equal the nominal time period. By acquiring a large number of binary words (time-periods) and averaging them ($N_{avg}$) provides time period $T_{nom}$ (Nominal time period). Thus $T_{nom} = N_{avg}*T_D$.

Since $N_{avg}$ and $T_{nom}$ are known, we get the estimate of $T_D$ from this equation. Once $T_D$ is known, then all the collected binary words ($N_j$) can be converted back into respective time periods ($T_j$). From the $T_j$'s and $T_{nom}$ the RMS period jitter can be calculated as $$T_{rms} = \sqrt{\frac{1}{N}\sum_{j=1}^{j=N}(T_j - T_{nom})^2}$$

This computation is relatively simple and can be performed efficiently on an inexpensive tester.

The Duty cycle measurement can be performed as follows in two steps. In the first step control signals E1_SEL and E2_SEL are chosen in such a manner, that the first edge E1 is generated on the rising edge of the clock signal IN while the second edge E2 is generated on the first falling edge of the clock signal IN. Thus E1 and E2 are separated by on-time of the clock. This separation is converted into a binary number "$N_{on}$". By taking many such measurements, average on-time of the clock is obtained, $N_{onavg}$.

In the second step, E1 and E2 are generated on first falling and rising edge of the input clock signal IN respectively. This is easily accomplished by changing E1_SEL and E2_SEL control bits. This corresponds to off-time and by averaging a large number of off-time measurements, $N_{offavg}$ is obtained.

The Duty-Cycle (DC) is then given by the formula:

$$DC = \frac{Nonavg}{Nonavg + Noffavg}$$

The accuracy of measured duty-cycle is better than 1% for clocks up to 800 MHz for a VDL resolution of 12 ps.

Figure 4:
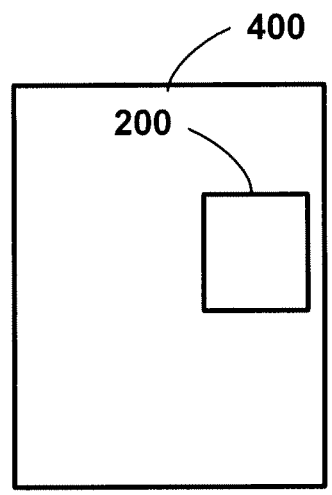
FIG. 4 illustrates a block diagram of a system that uses an apparatus, which measures time interval between two selected edges of a clock signal according to an embodiment of the present invention.

FIG. 4 illustrates a block diagram that discloses an application for an apparatus 200, which measures time interval between two selected edges of a clock signal, according to an embodiment of the present invention used in a system 400. System 400 includes the apparatus 200. Apparatus 200 includes an edge generator 201, a first multi-tap delay module 202, a second multi-tap delay module 203, and a multi-element phase detector 204.

Figure 5:
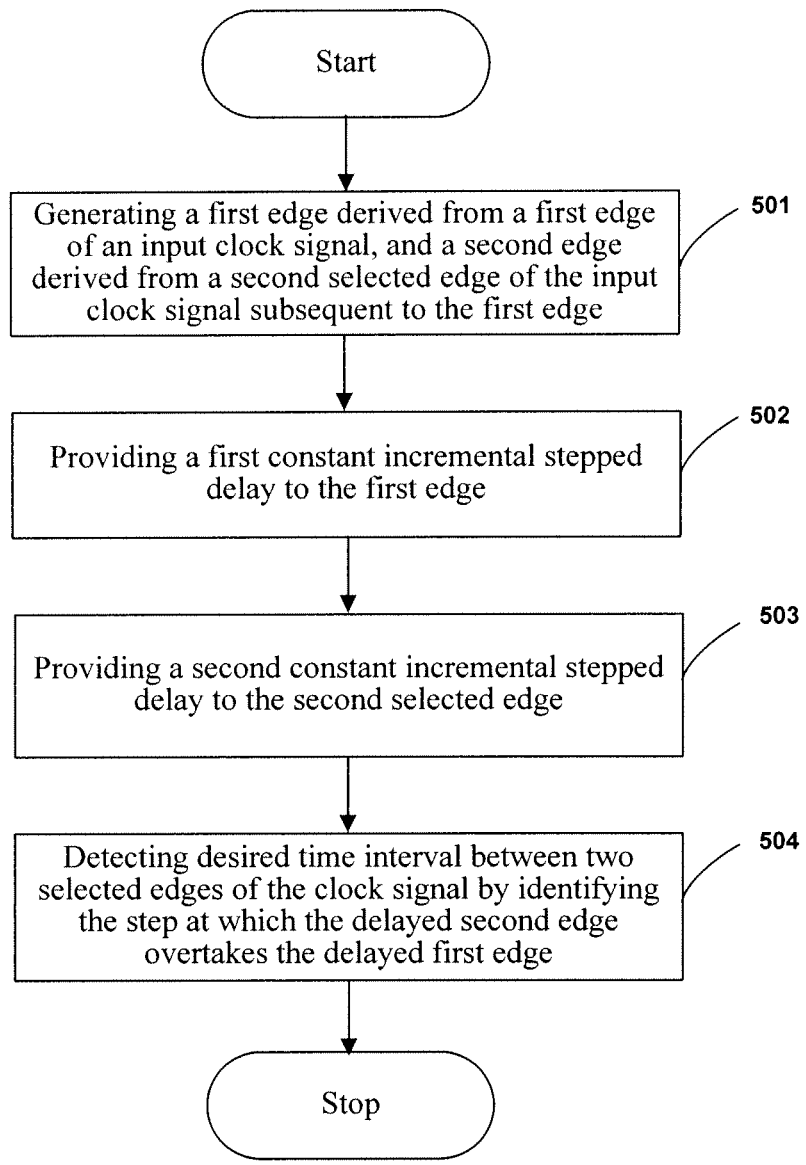
FIG. 5 illustrates a flow diagram of a method for measuring the time interval between two selected edges of a clock signal according to an embodiment of the present invention.

FIG. 5 illustrates a flow diagram of a method for measuring the time interval between two selected edges of a clock signal according to an embodiment of the present invention. At step 501, a first edge derived from a first edge of the input clock signal and a second edge derived from a second selected edge of the input clock signal are generated. At step 502, a first constant incremental stepped delay is provided to the first edge. At step 503, a second constant incremental stepped delay is provided to the second edge. At step 504, desired time interval is detected between two selected edges of the clock signal by identifying the step at which the delayed second edge overtakes the delayed first edge.

The embodiment of the present invention is related to an apparatus for measuring time interval between two selected edges of a clock signal and can be used in various applications, such as on-chip time interval measuring device.

The present invention offers the following advantages:

It does not require a reference clock for calibration or measurement.

It does not require a separate calibration method to estimate the VDL resolution.

It provides measurement of jitter characteristic and duty-cycle of a clock signal by a single circuit.

It is capable of measuring N period jitter.

The time interval measured in the present invention is small as compared to Vernier Oscillator technique. The longer time interval of Vernier Oscillator makes it more susceptible to low frequency noise on supplies.

It enables use of a latch as a phase detector since only edge is propagated along the delay line.

As only a single edge is propagated, the supply noise induced is very low.

Although the disclosure of system has been described in connection with an embodiment of the present invention illustrated in the accompanying drawings, it is not limited thereto. It will be apparent to those skilled in the art that various substitutions, modifications and changes may be made thereto without departing from the scope and spirit of the disclosure.

We claim:

1. A system comprising an apparatus for measuring a time interval between first and second selected edges of an input signal, said apparatus comprising:
    an edge generator having a first output node for producing a first edge derived from a first edge of the input signal, and a second output node for producing a second edge derived from the second selected edge of said input signal;
    a first multi-tap delay module having its input operatively coupled to said first output node of said edge generator for providing a first incremental delay at each tap provided by a first plurality of delay elements;
    a second multi-tap delay module having its input operatively coupled to said second output node of said edge generator for providing a second incremental delay at each tap provided by an equal-numbered second plurality of delay elements where said second incremental delay is less than said first incremental delay for each delay element in the second plurality of delay elements with respect to the corresponding delay element in the first plurality of delay elements; and
    a multi-element phase detector in which each element has a first input operatively coupled to a selected tap of said first multi-tap delay module, and a second input operatively coupled to a corresponding tap of said second multi-tap delay module, the outputs of said multi-element phase detector providing a value of the time interval.

2. The system as claimed in claim 1, wherein said edge generator comprises control signals for defining the second selected edge of the input signal relative to the first edge.

3. The system as claimed in claim 1, wherein the first plurality of delay elements in said first multi-tap delay module comprises a plurality of buffers.

4. The system as claimed in claim 1, wherein the second plurality of delay elements in said second multi-tap delay module comprises a plurality of buffers.

5. The system as claimed in claim 1, wherein each element of said phase detector comprises a latch.

6. An apparatus for measuring a time interval between first and second selected edges of an input signal, said apparatus comprising:
    an edge generator having a first output node for producing a first edge derived from a first edge of the input signal, and a second output node for producing a second edge derived from the second selected edge of said input signal;
    a first multi-tap delay module having its input operatively coupled to said first output node of said edge generator for providing a first incremental delay at each tap provided by a first plurality of delay elements;
    a second multi-tap delay module having its input operatively coupled to said second output node of said edge generator for providing a second incremental delay at each tap provided by an equal-numbered second plurality of delay elements where said second incremental delay is less than said first incremental delay for each delay element in the second plurality of delay elements with respect to the corresponding delay element in the first plurality of delay elements; and
    a multi-element phase detector in which each element has a first input operatively coupled to a selected tap of said first multi-tap delay module, and a second input operatively coupled to a corresponding tap of said second multi-tap delay module, wherein the outputs of said multi-element phase detector provide a value of the time interval.

7. The apparatus as claimed in claim 6, wherein said edge generator comprises control signals for defining the second selected edge of the input signal relative to the first selected edge.

8. The apparatus as claimed in claim 6, wherein the first plurality of delay elements in said first multi-tap delay module comprises a plurality of buffers.

9. The apparatus as claimed in claim 6, wherein the second plurality of delay elements in said second multi-tap delay module comprises a plurality of buffers.

10. The apparatus as claimed in claim 6, wherein each element of said phase detector comprises a latch.

11. A method for measuring a time interval between first and second selected edges of an input signal comprising:
- providing a first incremental stepped delay to the first selected edge provided by a first plurality of delay elements;
- providing a second incremental stepped delay to the second selected edge provided by an equal-numbered second plurality of delay elements where said second incremental stepped delay is less than said first incremental delay, and wherein the incremental delay for each delay element in the second plurality of delay elements is less than the incremental delay for each corresponding delay element in the first plurality of delay elements; and
- detecting a desired time interval between the first and second selected edges of the input signal by identifying the step at which the second selected edge overtakes the first selected edge.

12. The method as claimed in claim 11, further comprising:
- detecting an edge transition of the input signal and generating said first selected edge; and
- selecting a desired subsequent edge and generating said second selected edge.

\* \* \* \* \*